United States Patent
Hild et al.

(10) Patent No.: US 11,366,395 B2
(45) Date of Patent: Jun. 21, 2022

(54) MIRROR, IN PARTICULAR FOR A MICROLITHOGRAPHIC PROJECTION EXPOSURE SYSTEM

(71) Applicant: Carl Zeiss SMT GmbH, Oberkochen (DE)

(72) Inventors: Kerstin Hild, Waldstetten (DE); Toralf Gruner, Aalen (DE); Vitaliy Shklover, Heidenheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 31 days.

(21) Appl. No.: 17/092,282

(22) Filed: Nov. 8, 2020

(65) Prior Publication Data

US 2021/0055662 A1 Feb. 25, 2021

Related U.S. Application Data

(63) Continuation of application No. PCT/EP2019/060523, filed on Apr. 24, 2019.

(30) Foreign Application Priority Data

May 8, 2018 (DE) ..................... 10 2018 207 146.2

(51) Int. Cl.
   *G03F 7/20* (2006.01)
   *G02B 5/08* (2006.01)
   (Continued)

(52) U.S. Cl.
   CPC ......... *G03F 7/70316* (2013.01); *G02B 5/085* (2013.01); *G02B 5/0891* (2013.01);
   (Continued)

(58) Field of Classification Search
   CPC ... G03F 7/70316; G02B 5/085; G02B 5/0891; G02B 26/0825; G02B 27/0668; G21K 1/062
   See application file for complete search history.

(56) References Cited

U.S. PATENT DOCUMENTS

10,684,466 B2 * 6/2020 Hakvoort ........... G02B 26/0858
2014/0285783 A1 9/2014 Dinger et al.
(Continued)

FOREIGN PATENT DOCUMENTS

DE 102011005940 A1 9/2012
DE 102011081603 A1 10/2012
(Continued)

OTHER PUBLICATIONS

International Search Report, PCT/EP2019/060523, dated Aug. 19, 2019, 4 pages.
(Continued)

*Primary Examiner* — Hung V Nguyen
(74) *Attorney, Agent, or Firm* — Edell, Shapiro & Finnan, LLC (57) ABSTRACT

A mirror that has a mirror substrate (12), a reflection layer stack (21) reflecting electromagnetic radiation incident on the optical effective surface (11), and at least one piezoelectric layer (16) arranged between the mirror substrate and the reflection layer stack and to which an electric field for producing a locally variable deformation is applied by way of a first electrode arrangement and a second electrode arrangement situated on alternate sides of the piezoelectric layer. In one aspect, both the first and the second electrode arrangements have a plurality of electrodes (20a, 20b), to each of which an electrical voltage relative to the respective other electrode arrangement can be applied via leads (19a, 19b). Separate mediator layers (17a, 17b) set continuous electrical potential profiles along the respective electrode arrangement, and where said mediator layers differ from one another in their average electrical resistance by a factor of at least 1.5.

15 Claims, 6 Drawing Sheets

(51) Int. Cl.
*G02B 26/08* (2006.01)
*G02B 27/00* (2006.01)
*G21K 1/06* (2006.01)

(52) U.S. Cl.
CPC ..... *G02B 26/0825* (2013.01); *G02B 27/0068* (2013.01); *G21K 1/062* (2013.01)

(56) References Cited

U.S. PATENT DOCUMENTS

2016/0209751 A1 7/2016 Gruner et al.
2020/0174379 A1 6/2020 Wylie-Van Eerd et al.

FOREIGN PATENT DOCUMENTS

| | | |
|---|---|---|
| DE | 102011077234 A1 | 12/2012 |
| DE | 102011084649 A1 | 4/2013 |
| DE | 102013219583 A1 | 4/2015 |
| DE | 102015213273 A1 | 1/2017 |
| DE | 102015213275 A1 | 1/2017 |
| DE | 102016224202 A1 | 1/2017 |
| DE | 102017213900 A1 | 2/2019 |
| WO | 2013057046 A1 | 4/2013 |

OTHER PUBLICATIONS

German Office Action with English translation, Application No. 10 2018 207 146.2, dated Mar. 15, 2019, 13 pages.
International Preliminary Report on Patentability and Written Opinion with English translation, PCT/EP2019/060523, dated Nov. 10, 2020, 16 pages.

* cited by examiner

Prior art

Fig. 6

MIRROR, IN PARTICULAR FOR A MICROLITHOGRAPHIC PROJECTION EXPOSURE SYSTEM

CROSS REFERENCE TO RELATED APPLICATIONS

This is a Continuation of International Application PCT/EP2019/060523, which has an international filing date of Apr. 24, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 207 146.2 filed on May 8, 2018.

FIELD OF THE INVENTION

The invention relates to a mirror, in particular for a microlithographic projection exposure apparatus.

BACKGROUND

Microlithography is used for producing microstructured components such as, for example, integrated circuits or LCDs. The microlithography process is conducted in a so-called projection exposure apparatus, which comprises an illumination device and a projection lens. The image of a mask (=reticle) illuminated with the illumination device is projected with the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the extreme ultraviolet (EUV) range, i.e., at wavelengths of, e.g., approximately 13 nm or approximately 7 nm, mirrors are used as optical components for the imaging process owing to the lack of availability of suitable light-transmissive refractive materials.

In this case, it is also known to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer stack of the adaptive mirror also deforms, with the result that, for example, imaging aberrations (possibly also temporally variable imaging aberrations) can be at least partly compensated for by suitably driving the electrodes.

Figure 5:
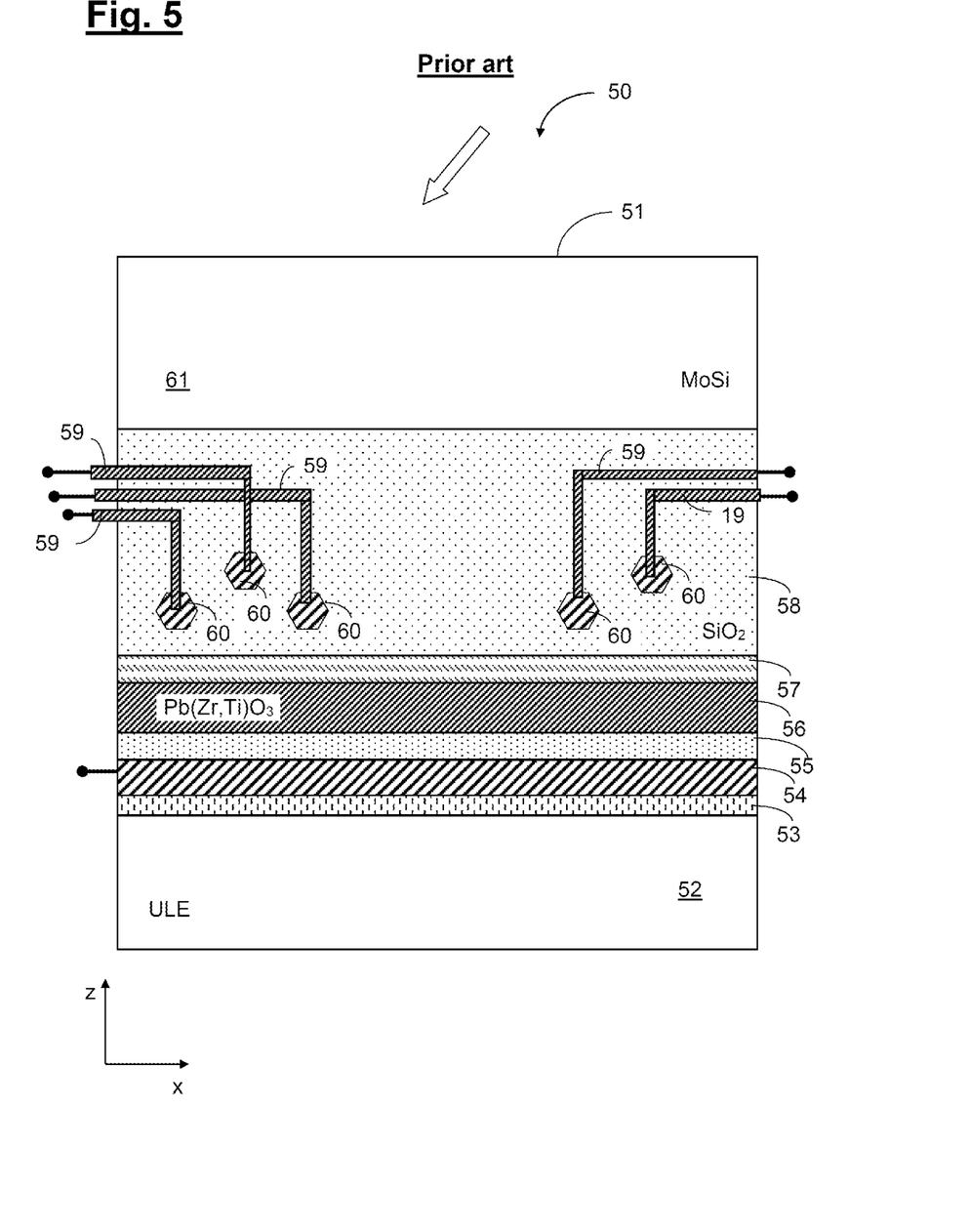
FIG. 5 shows a schematic illustration for explaining the possible construction of a conventional adaptive mirror.

FIG. 5 shows a representative, feasible construction of a conventional adaptive mirror 50, in a merely schematic illustration. The mirror 50 comprises in particular a mirror substrate 52 and also a reflection layer stack 61 and has a piezoelectric layer 56, which is produced from lead zirconate titanate ($Pb(Zr,Ti)O_3$, PZT) in the example. Electrode arrangements are respectively situated above and below the piezoelectric layer 56, by way of which electrode arrangements an electric field for producing a locally variable deformation is able to be applied to the mirror 50. Of said electrode arrangements, the second electrode arrangement facing the substrate 52 is configured as a continuous, planar electrode 54 of constant thickness, whereas the first electrode arrangement has a plurality of electrodes 60, to each of which an electrical voltage relative to the electrode 54 is able to be applied by way of a lead 59. The electrodes 60 are embedded into a common smoothing layer 58, which is produced e.g. from quartz ($SiO_2$) and serves for levelling the electrode arrangement formed from the electrodes 60. Furthermore, the mirror 50 has, between the mirror substrate 52 and the bottom electrode 54 facing the mirror substrate 52, an adhesion layer 53 (e.g. composed of titanium, Ti) and a buffer layer 55 (e.g. composed of $LaNiO_3$), which is arranged between the electrode arrangement 54 facing the substrate 52 and the piezoelectric layer 56 and which further supports the growth of PZT in an optimum, crystalline structure and ensures consistent polarization properties of the piezoelectric layer over the service life.

During operation of the mirror 50 or of an optical system comprising said mirror 50, applying an electrical voltage to the electrodes 54 and 60, by way of the electric field that forms, results in a deflection of the piezoelectric layer 56. In this way, it is possible—for instance for the compensation of optical aberrations e.g. owing to thermal deformations in the case of EUV radiation incident on the optical effective surface 51—to achieve an actuation of the mirror 50.

In accordance with FIG. 5, the mirror 50 furthermore has a mediator layer 57. Said mediator layer 57 is in direct electrical contact with the electrodes 60 (which are illustrated in plan view in FIG. 5 only for elucidation purposes). Said mediator layer 57 serves to "mediate" between the electrodes 60 in terms of potential, wherein it has only low electrical conductivity (preferably less than 200 siemens/meter (S/m)), with the consequence that a potential difference existing between adjacent electrodes 60 is dropped substantially across the mediator layer 57.

Figure 6:
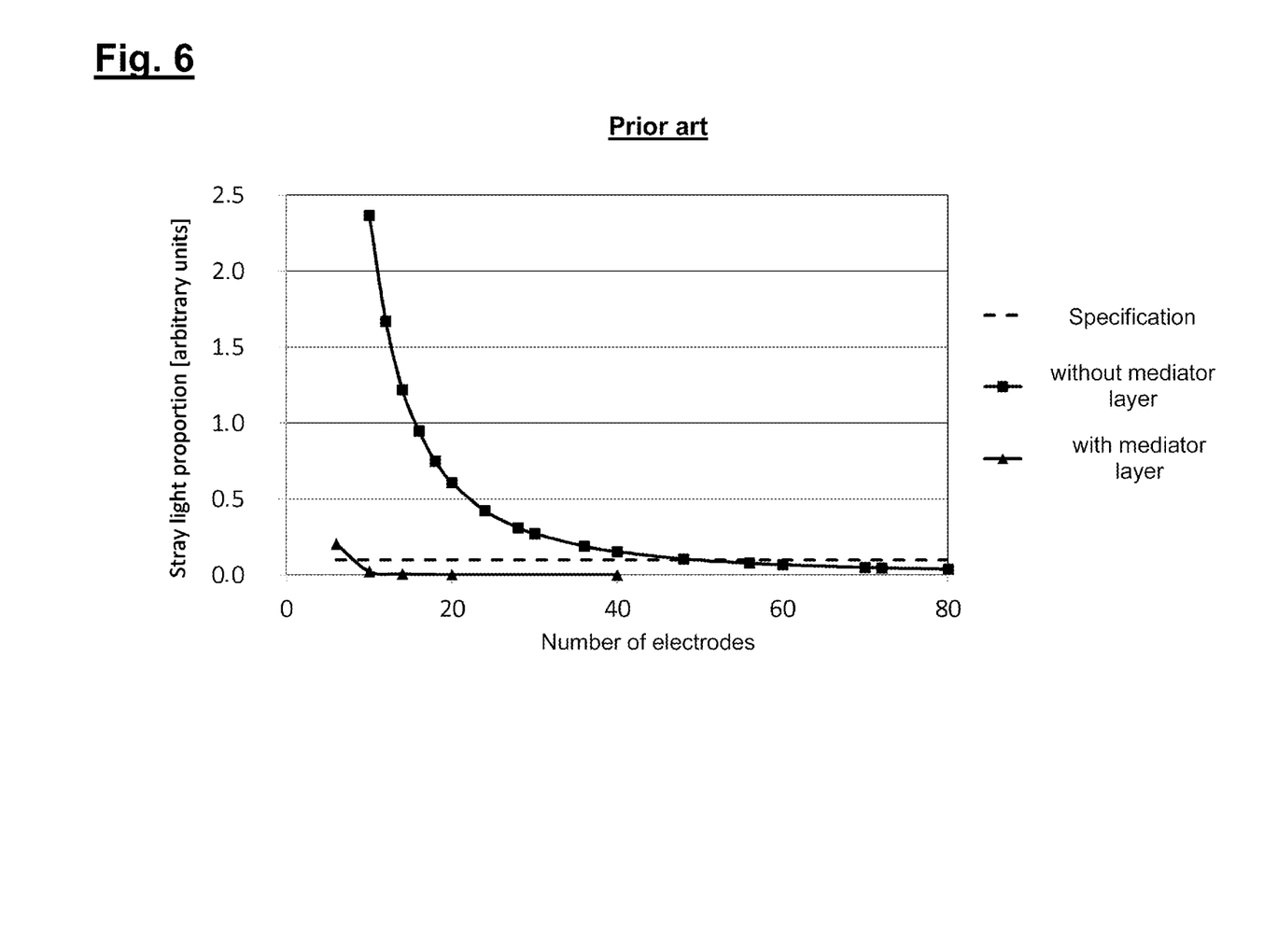
FIG. 6 shows a diagram for explaining the influence of a mediator layer in a conventional adaptive mirror in accordance with FIG. 5.

An advantage achieved owing to the presence of the mediator layer 57 is evident from the diagram in FIG. 6, in which diagram the stray light proportion is plotted as a function of the number of electrodes 60. As illustrated in FIG. 6, in order to fall below an upper threshold (i.e., an exemplary, predefined "Specification") for the stray light proportion, in the example chosen, a number of sixty electrodes is required in each of two mutually perpendicular spatial directions if no mediator layer 57 is present. In other words, a total number of 60*60=3600 electrodes is required without the presence of the mediator layer 57. If, on the other hand, the mediator layer 57 is present, said number can be reduced to fewer than ten electrodes in one of the two mutually perpendicular spatial directions, with the consequence that the realizability of the electrode arrangement formed from the electrodes 60 is significantly simplified.

The above-described application of electrical voltage to the electrode arrangements in the adaptive mirror results in an electric current in the mediator layer 57 and thus, by way of the electrical power generated thereby, in an undesired development of heat. It is therefore desirable, in principle, to limit said electrical power by setting a sufficiently high electrical resistance of the mediator layer (of e.g. 100 kΩ). Even though such a configuration may be suitable for specific scenarios of use of the adaptive mirror, such as e.g. for correcting the influence of deformations of the optical elements, such as mirrors or lens elements that are induced thermally by absorption of radiation, in practice scenarios also exist in which the setting of the desired surface shape of the adaptive mirror has to be effected on a significantly shorter timescale, e.g. within milliseconds (ms).

Such scenarios, in which the electrical potential would propagate too slowly in a mediator layer having the above-mentioned high resistances for limiting the electrical power, include e.g. accounting for thermally induced mask deformations in the lithography process. In such event, owing to the absorption of, in terms of magnitude, more than 30% of the EUV light, the mask forms an irregular "mountainous region", which ultimately results in a focus variation in the lithographic imaging process.

In order to take into account the above-described variation in surface shape of the mask by setting the adaptive mirror accordingly has to take place in the lithography process during the scanning operation itself, which lasts on the order of 100 ms, and thus must take place on a comparatively small time scale of milliseconds (ms). Even though it is readily possible to drive the electrodes in the adaptive mirror sufficiently fast, the practical implementation of the above-mentioned small time constants proves to be problematic with regard to the mediator layer, since reducing the electrical resistance of the mediator layer in turn results in thermal problems, owing to the above-described reciprocal dependence involving the electrical power.

Regarding the prior art, reference is made merely by way of example to DE 10 2013 219 583 A1 and DE 10 2015 213 273 A1.

SUMMARY

It is an object of the present invention to provide a mirror, in particular for a microlithographic projection exposure apparatus, which, based on the principle of the locally varying deformation of a piezoelectric layer, enables aberrations of various types to be corrected better than was heretofore possible while at the same time generating as little heat as possible in the optical system.

This and related objects are achieved in accordance with the novel structures and innovations described hereinbelow.

A mirror according to one aspect of the invention comprises:
  an optical effective surface,
  a mirror substrate;
  a reflection layer stack for reflecting electromagnetic radiation that is incident on the optical effective surface, and
  at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate;
  wherein both the first electrode arrangement and the second electrode arrangement have a plurality of electrodes, to each of which an electrical voltage relative to the respective other electrode arrangement is able to be applied by way of a lead;
  wherein each of said electrode arrangements is respectively assigned a separate mediator layer for setting a continuous profile of the electrical potential along the respective electrode arrangement; and
  where said mediator layers differ from one another in their average electrical resistance by a factor of at least 1.5.

The present invention makes use of the concept, in particular, in the case of an adaptive mirror comprising a piezoelectric layer, to which an electric field for producing a locally variable deformation is able to be applied via electrode arrangements, for the purpose of mediation in potential between the respective electrodes of an electrode arrangement, of not using just a single mediator layer having a comparatively low electrical conductivity, but rather of using two separate mediator layers from the outset. This permits—through a division of tasks as described below—the different requirements or scenarios of use that occur during practical operation to be taken into account in each case in a targeted manner and without undesired acceptance of compromises (for instance with regard to thermal problems).

In particular, this aspect of the invention here includes the concept of designing one of two separate and different mediator layers for realizing a comparatively fast potential propagation within the mediator layer with a comparatively low electrical resistance (e.g. with an electrical resistance of 1 kilohm (k$\Omega$) for realizing a switching time with regard to the electrical potential of 100 ms) and the second separate mediator layer with a significantly higher electrical resistance (e.g. 100 k$\Omega$), in order in this respect to limit the generation of electrical power as far as possible and here to accept comparatively longer switching times with regard to the electrical potential established in each case in the mediator layer (e.g. switching times on the order of 10 s or more).

The above-described concept according to the invention is based on the further consideration that in the typical application scenarios for the mediator layer mentioned first, which has a comparatively low electrical resistance and thus enables fast switching with regard to the electrical potential or with regard to the effect of the adaptive mirror, such as e.g. in the application for taking into account thermally induced mask deformations in the lithography process, the (deformation) amplitudes typically required are comparatively small and, merely by way of example, may be on the order of magnitude of 1 nm.

By contrast, the (deformation) amplitudes typically required in the use scenario—likewise described above—of correcting the influence of deformation of optical elements, such as mirrors or lens elements, that is induced thermally by absorption of radiation are comparatively larger and may be e.g. on the order of magnitude of 10 nm.

The differences thus present with regard to the order of magnitude of the deformation amplitudes to be set in each case in the different use scenarios can now be used in the context of the invention to the effect that for correcting the influence of thermally induced deformations e.g. of mirrors, although comparatively large gradients of the electrical voltage are required on the part of the relevant mediator layer (having a comparatively higher resistance), a significantly higher electrical resistance can also be accepted since comparatively more time is available for switching between the respective electrical potentials. By contrast, for the application scenario of taking into account thermally induced mask deformations in the lithography process, the mediator layer having a comparatively low resistance (e.g. having an electrical resistance of 1 k$\Omega$) can be used since, in this respect, only comparatively small deformation amplitudes and thus also small gradients of the electrical voltage are required and the development of heat accompanying electric current flow is thus significantly limited from the outset.

In summary, in accordance with one aspect of the invention, a functional division between two mutually separate mediator layers is effected, of which one mediator layer is designed for "fast operation" (i.e. switching between different electrical potentials on a comparatively short timescale of e.g. on the order of 1 ms) with a small amplitude (e.g. on the order of 1 nm) and the other mediator layer is designed for comparatively "slow operation" (e.g. switching between different electrical potentials on a longer timescale on the order of 10 s) with a comparatively large amplitude (e.g. 10 nm).

Both mediator layers are drivable independently of one another with regard to the electrical voltage, wherein the potential difference between the electrical potentials set by way of the two mediator layers is once again crucial for the locally varying deformation set in the piezoelectric layer.

In other words, during operation of the adaptive mirror according to this aspect of the invention, depending on what effect is intended to be corrected precisely with the set locally variable deformation of the adaptive mirror, one mediator layer or the other (optionally also a suitable combination) is used for producing the corresponding deformation.

In this case, owing to the circumstance that in each case structured electrode arrangements are required for both mediator layers used according to the invention, this aspect of the invention deliberately accepts a higher outlay from the standpoint of production engineering for instance in comparison with a conventional construction that manages with only one mediator layer e.g. in accordance with FIG. 5 (in which one electrode arrangement can be embodied as a planar electrode and thus only one structured electrode arrangement is required).

This aspect of invention accepts this disadvantage in order in return, through the above-described division of tasks with regard to the two mediator layers according to the invention, to be able to satisfy in a targeted manner the requirements that exist in each case in different application scenarios, and to realize here as a result correction of aberrations as optimally as possible with at the same time as little heat as possible being generated in the optical system.

In accordance with one embodiment, the mediator layers differ from one another in their average electrical resistance by a factor of at least 3, in particular by a factor of at least 5.

In accordance with one embodiment, the mediator layers differ from one another in their average thickness (wherein the different electrical resistance can be provided via different thicknesses in particular in the case where identical materials are used for the mediator layer).

In accordance with one embodiment, the mediator layers differ from one another with regard to their stoichiometry (wherein, with identical thicknesses, in particular, the different electrical resistance can be provided by the use of different materials for the mediator layer). In this case, in particular, a difference in the stoichiometry can be produced even in the case of identical material and identical thickness, by varying the background pressure during deposition, by varying the oxygen partial pressure or by adapting the deposition temperature.

In accordance with one embodiment, the material of at least one of the mediator layers comprises titanium dioxide ($TiO_2$), $LaCoO_3$, $LaMnO_3$, $LaCaMnO_3$ or $LaNiO_3$.

In accordance with a further aspect, the invention also relates to a mirror, in particular for a microlithographic projection exposure apparatus, wherein the mirror has an optical effective surface, comprising
  a mirror substrate,
  a reflection layer stack for reflecting electromagnetic radiation that is incident on the optical effective surface,
  at least one piezoelectric layer, which is arranged between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate,
  wherein at least one of said electrode arrangements is assigned a mediator layer having a controllable electrical conductivity for the temporally variable setting of a continuous profile of the electrical potential along the respective electrode arrangement.

In accordance with one embodiment, the mirror has at least one control electrode, in particular a plurality of mutually independently operable control electrodes, for controlling the electrical conductivity of the mediator layer.

With this configuration, the electrical voltage of the mediator layer can be set in a temporally variable manner. In this case, a comparatively higher electrical conductivity or a lower average electrical resistance can serve for setting comparatively smaller deformation amplitudes on a smaller time scale, whereas the electrical conductivity can then be correspondingly decreased for the purpose of setting comparatively higher deformation amplitudes on a longer time scale.

The mirror can be in particular a mirror for a microlithographic projection exposure apparatus. However, the invention is not limited thereto. In other applications, a mirror according to the invention can also be employed or utilized for example in an apparatus for mask metrology.

In accordance with one embodiment, the mirror is designed for an operating wavelength of less than 30 nm, in particular less than 15 nm. However, the invention is not limited thereto, and the invention can therefore also be realized advantageously in further applications in an optical system having an operating wavelength in the VUV range (for example of less than 200 nm).

The concept according to the invention of using two separate mediator layers in order to achieve the division of tasks described above is not limited to realization in one and the same adaptive mirror. Rather, the two mediator layers used according to the invention can also be present on two separate adaptive mirrors, wherein then in this respect, analogously to FIG. 5, each of these mediator layers can be assigned a structured electrode arrangement and an electrode arrangement designed as a planar electrode. In this case, preferably that adaptive mirror with the mediator layer having a comparatively low resistance (for the fast setting of comparatively small deformation amplitudes e.g. for correcting a thermally induced mask deformation) is positioned in a near-field plane of the optical system, whereas the other adaptive mirror with the mediator layer having a comparatively higher resistance (for the comparatively slow setting of larger deformation amplitudes e.g. for correcting thermally induced mirror deformations) is positioned in a near-pupil position.

In accordance with a further aspect, the invention therefore also relates to an optical system, in particular an illumination device or a projection lens of a microlithographic projection exposure apparatus, comprising at least two mirrors, wherein each of said mirrors has an optical effective surface, a mirror substrate and a reflection layer stack for reflecting electromagnetic radiation that is incident on the optical effective surface,
  wherein each of said mirrors has a piezoelectric layer, which is arranged in each case between the mirror substrate and the reflection layer stack and to which an electric field for producing a locally variable deformation is able to be applied by way of a first electrode arrangement situated on the side of the piezoelectric layer facing the reflection layer stack, and by way of a second electrode arrangement situated on the side of the piezoelectric layer facing the mirror substrate, wherein each of said mirrors has in each case a mediator layer for setting a continuous profile of the electrical potential, and where said mediator layers differ from one another in their average electrical resistance by a factor of at least 1.5.

The invention furthermore relates to an optical system of a microlithographic projection exposure apparatus, in particular an illumination device or a projection lens, comprising at least one mirror having the above-described features, and also to a microlithographic projection exposure apparatus.

Further configurations of the invention can be gathered from the description and the dependent claims.

The invention is explained in greater detail below on the basis of exemplary embodiments illustrated in the accompanying figures.

DETAILED DESCRIPTION

Figure 1:
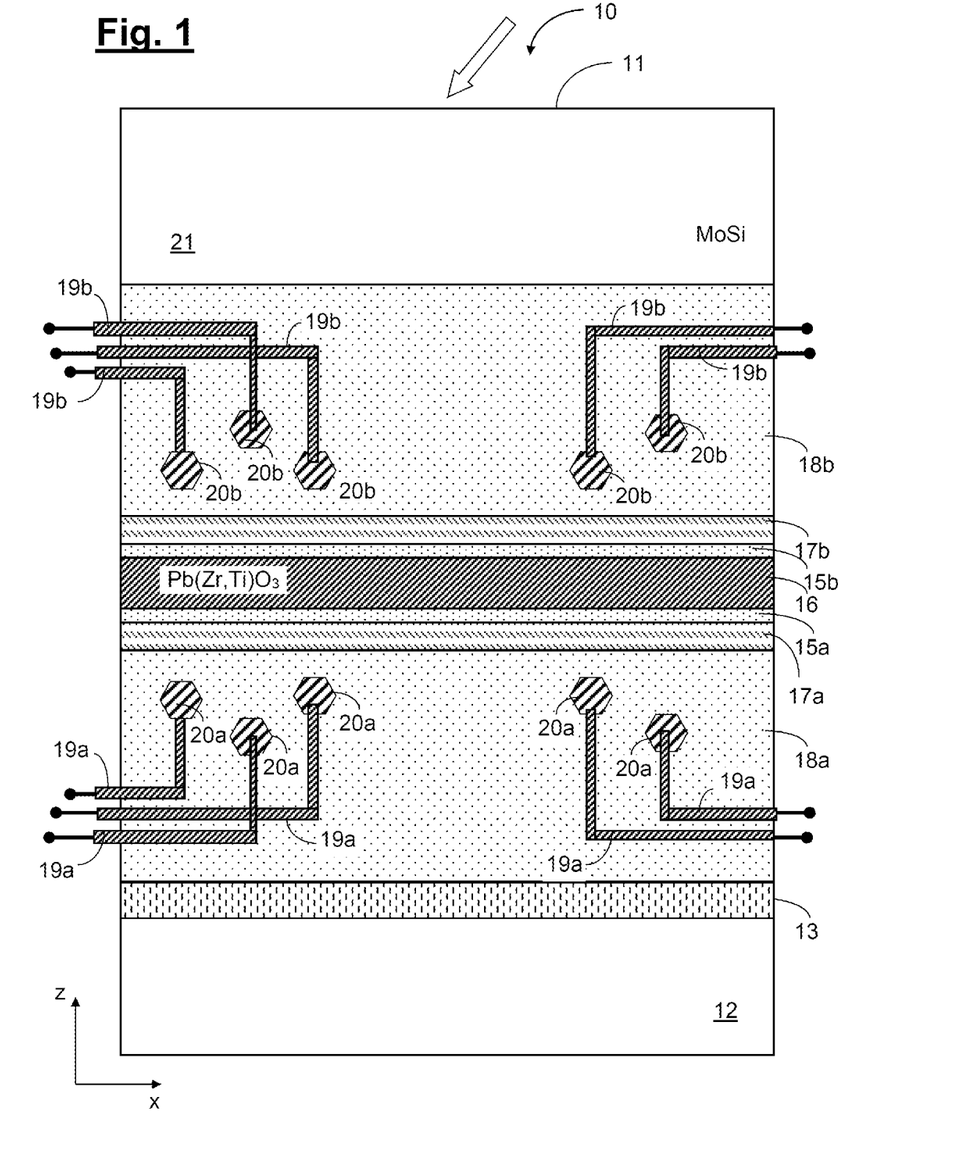
FIG. 1 shows a schematic illustration for describing the construction of an adaptive mirror in accordance with one embodiment of the invention which utilizes two mediator layers.

FIG. 1 shows a schematic illustration for elucidating the construction of a mirror according to the invention in one exemplary embodiment of the invention. The mirror 10 comprises in particular a mirror substrate 12, which is produced from any desired suitable mirror substrate material. Suitable mirror substrate materials are e.g. quartz glass doped with titanium dioxide ($TiO_2$), with materials that are usable being, merely by way of example (and without the invention being restricted thereto), those sold under the trade names ULE® (from Corning Inc.) or Zerodur® (from Schott AG).

Furthermore, the mirror 10 has, in a manner known per se in principle, a reflection layer stack 21, which, in the embodiment illustrated, comprises merely by way of example a molybdenum-silicon (Mo—Si) layer stack. Without the invention being restricted to specific configurations of this layer stack, one suitable construction that is merely by way of example can comprise approximately 50 plies or layer packets of a layer system comprising molybdenum (Mo) layers having a layer thickness of in each case 2.4 nm and silicon (Si) layers having a layer thickness of in each case 3.3 nm.

The mirror 10 can be in particular an EUV mirror of an optical system, in particular of the projection lens or of the illumination device of a microlithographic projection exposure apparatus.

The impingement of electromagnetic EUV radiation (indicated by an arrow in FIG. 1) on the optical effective surface 11 of the mirror 10 during operation of the optical system can have the consequence of an inhomogeneous volume change of the mirror substrate 12 due to the temperature distribution which results from the absorption of the radiation that is incident inhomogeneously on the optical effective surface 11. In order to correct such an undesired volume change or else in order to correct other aberrations that occur during operation of the microlithographic projection exposure apparatus, the mirror 10 is of adaptive design, as is explained in greater detail below. In this respect, the mirror 10 according to the invention has a piezoelectric layer 16, which is produced from lead zirconate titanate (Pb(Zr,Ti)$O_3$, PZT) in the exemplary embodiment. In further embodiments, the piezoelectric layer 16 can also be produced from some other suitable material (e.g. aluminum nitride (AlN), aluminum scandium nitride (AlScN), lead magnesium niobate (PbMgNb) or vanadium-doped zinc oxide (ZnO)). The piezoelectric layer 16 can have for example a thickness of less than 5 μm, more particularly a thickness in the range of 1 μm to 4 μm. In embodiments, the performance of the piezoelectric layer 16 can be increased by a calcium niobate layer (CaNbO$_3$ layer) being introduced at a suitable location of the layer stack. The increase in performance is achieved here by the piezoelectric layer 16 preferably growing in the [001] crystal direction.

An electric field for producing a locally variable deformation is able to be applied to the piezoelectric layer 16 by way of a first electrode arrangement having electrodes 20b (which are connected to leads 19b), said first electrode arrangement being situated on the side of the piezoelectric layer 16 facing the reflection layer stack 21, and by way of a second electrode arrangement having electrodes 20a (which are connected to leads 19a), said second electrode arrangement being situated on the side of the piezoelectric layer 16 facing the mirror substrate 12.

The electrodes 20a and 20b are respectively embedded into a smoothing layer 18a and 18b, which is produced from quartz (SiO$_2$) in the exemplary embodiment and serves for levelling the electrode arrangement formed from the electrodes 20a and 20b, respectively. Furthermore, the electrodes 20a and 20b respectively have—without the invention being restricted thereto—a hexagonal geometry, wherein in particular they can also be arranged substantially over a wide area and in a manner isolated from one another only by way of comparatively narrow trenches. The invention is generally not restricted to specific geometries of the electrodes or distances therebetween (wherein the distance between the electrodes can also be e.g. a number of millimeters (mm) or a number of centimeters (cm)).

In accordance with FIG. 1, the leads 19a and 19b respectively each have a first section, which runs perpendicular to the stacking direction of the reflection layer stack 21, and a second section (also referred to as "via" or "plated-through hole"), which runs in the stacking direction of the reflection layer stack 21. Other types of contacting are also possible, wherein e.g. the leads in further embodiments can also be realized with just one section running perpendicular to the stacking direction (in a two-dimensional design and without "vias").

Furthermore, the mirror 10 in accordance with FIG. 1 has an optional adhesion layer 13 (in the example composed of titanium, Ti) between the mirror substrate 12 and the bottom electrode arrangement formed from the electrodes 20a and facing the mirror substrate 12. Furthermore, buffer layers present on both sides of the piezoelectric layer 16 are designated by "15a" and "15b", respectively. Same buffer layers 15a, 15b serve to further support the growth of PZT in an optimum, crystalline structure and to ensure consistent polarization properties of the piezoelectric layer 16 over the service life, and can be produced e.g. from LaNiO$_3$.

During operation of the mirror 10 or of an optical system comprising said mirror 10, applying an electrical voltage to the electrode arrangements formed from the electrodes 20a and 20b, respectively, by way of the electric field that forms in the region of the piezoelectric layer 16, results in a deflection of said piezoelectric layer 16. In this way, it is possible to achieve an actuation of the mirror 10 for compensating optical aberrations.

In contrast to the conventional construction of an adaptive mirror described in the introduction with reference to FIG. 5, in the case of the mirror 10 according to the invention as described here with reference to FIG. 1, the electrode arrangements situated on mutually opposite sides of the piezoelectric layer 16 are assigned in each case separate mediator layers 17a and 17b, respectively, for setting a continuous profile of the electrical potential along the respective electrode arrangement.

In this arrangement, both mediator layers 17a and 17b respectively—if they are produced from LaNiO$_3$—can then also serve as buffer layers for the PZT of the piezoelectric layer 16, in which case separate buffer layers 15a, 15b can then be dispensed with. By contrast, if the mediator layer is produced from a different material than LaNiO$_3$, buffer layers 15a, 15b are provided, as illustrated, on both sides of the PZT of the piezoelectric layer 16.

Furthermore, in contrast to the conventional arrangement depicted in FIG. 5, rather than for instance one of the two electrode arrangements being embodied as a planar continuous electrode, both electrode arrangements situated on mutually opposite sides of the piezoelectric layer 16 comprise electrodes 20a, 20b, to which electrical voltage is able to be applied by way of separate leads in each case.

The mediator layers 17a and 17b are not embodied identically to one another, but rather differ from one another with regard to their average electrical resistance by a factor of at least 1.5 (in further embodiments by a factor of at least 3, in particular by a factor of at least 5). For this purpose, the mediator layers 17a, 17b have mutually different stoichiometries and/or mutually different average thicknesses. Different stoichiometries can be achieved e.g. by way of different partial pressures, different background pressures or different temperatures during deposition. The use of different materials for the mediator layer is likewise possible.

The different configuration of the mediator layers 17a, 17b with regard to their respective electrical resistance has the consequence that the mediator layer having a comparatively low resistance enables the respective electrical potential to be "switched" comparatively faster or on a shorter time scale during operation of the mirror 10 or of the associated optical system, whereas on account of the reciprocal dependence of the generated electrical power on the electrical resistance, the mediator layer having a comparatively higher resistance results in comparatively low thermal loads during operation of the mirror 10 or of the relevant optical system.

These different characteristic properties can, in turn, be used, as already described above, in order to utilize the particular electrode arrangement which is assigned to the mediator layer that has the relatively lower average electrical resistance in order to apply particular voltages for the purpose of producing locally variable deformations of the piezoelectric layer 16. This is desirable especially in scenarios in which comparatively small deformation amplitudes are to be set on a comparatively short time scale. One such exemplary embodiment is, in particular, the compensation of thermally induced mask deformations during a given lithography operation. By contrast, the electrode arrangement assigned to the mediator layer having the relatively higher electrical resistance is used for setting comparatively larger deformation amplitudes on a longer time scale. One exemplary scenario for this is the compensation of thermally induced mirror deformations or aberrations caused thereby in the optical system.

In one specific exemplary embodiment, for instance, the mediator layer 17b can have an average electrical resistance of 100 kΩ and can be driven with electrical voltages in the range of 100 V, in order to make it possible to switch between deformation amplitudes on the scale of 10 nm on a time scale of 10 s. The deformations of the adaptive mirror provided as a result are suitable for compensating the above-described thermally induced mirror deformations in the optical system.

By contrast, merely by way of example, the mediator layer 17a can have an average electrical resistance of 1 kΩ and can be driven with electrical voltages having an amplitude of approximately 10 V, in order to switch between deformation amplitudes on the scale of 1 nm in approximately 100 ms. The deformations of the adaptive mirror 10 brought about thereby are suitable for compensating the thermally induced mask deformations—likewise described above—during lithography operation.

In a further embodiment (not illustrated by one specific figure), the separate mediator layers described above, which differ from one another with regard to their average electrical resistance, can also be realized in different separate mirrors in order to take account of the abovementioned use scenarios in each case in a targeted manner or to realize the above-described division of tasks with regard to the compensation of different aberrations during operation of the optical system. For this purpose, preferably, the adaptive mirror having the mediator layer with a comparatively low resistance and serving for the compensation of thermally induced mask deformations is positioned in a near-field plane and the other adaptive mirror, having the mediator layer with a comparatively higher resistance and serving for the compensation of thermally induced mirror deformations is positioned in a near-pupil plane.

In further embodiments described below with reference to FIG. 2 and FIG. 3, the mediator layer in an adaptive mirror according to the invention can also be designed such that the electrical conductivity of the mediator layer is controllable or can be set in a temporally variable manner during operation.

Figure 2:
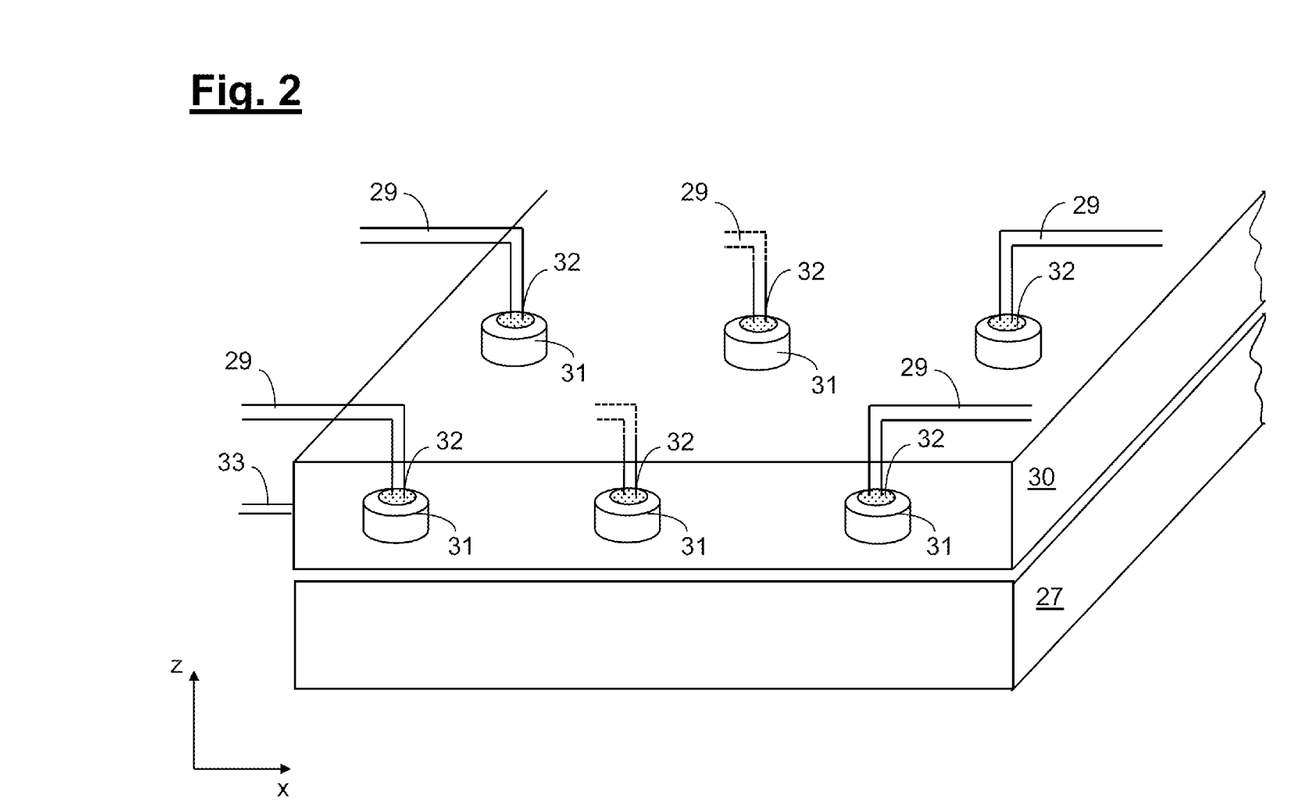
FIG. 2 shows a schematic illustration for describing the construction of an adaptive mirror in accordance with a second embodiment of the invention, which utilizes a controllable mediator layer.

In one exemplary embodiment, merely illustrated schematically in FIG. 2, "27" denotes a mediator layer with FET structure, which can be produced e.g. from doped semiconductor material and the electrical conductivity of which is controlled by way of a control electrode 30 configured in a continuous fashion (to which control electrode an electric field is able to be applied by way of a lead 33). In FIG. 2, "32" denotes the electrodes serving for controlling the deflection of the piezoelectric layer (not illustrated in FIG. 2), wherein these electrodes 32 are electrically insulated from the control electrode 30 with insulators 31.

In accordance with the configuration illustrated in FIG. 2, the electrical voltage of the mediator layer 27 can be set in a temporally variable manner. In this case, a comparatively higher electrical conductivity or a lower average electrical resistance, analogously to the embodiment described above with reference to FIG. 1, can serve for setting comparatively smaller deformation amplitudes on a smaller time scale, whereas the electrical conductivity can then be correspondingly decreased for the purpose of setting comparatively higher deformation amplitudes on a longer time scale.

During exemplary operation of the arrangement in FIG. 2, a maximum permissible evolution of heat can be predefined in a first step, wherein proceeding from the deformation profile that is desired or to be aimed at in each case, the FET control voltage is then chosen in a second step such that precisely that maximum conductivity of the mediator layer arises which leads to said maximum evolution of heat. In this way, at any point in time it is possible to achieve a maximum speed with regard to setting the electrical potential that is desired in each case. The maximum evolution of heat can be characterized here by way of either a global value or a local peak value. If the setting speed attained is lower than desired with regard to the deformation pattern or electrical potential striven for, the deformation amplitude can alternatively be "scaled down" in such a way that both the desired setting speed and the maximum evolution of heat are attained. Alternatively or additionally, feedback to an external closed-loop control loop can also be effected, which ensures a suitable compromise for ensuring the best possible correction taking into account the requirements with regard to the setting speed and evolution of heat.

Figure 3:
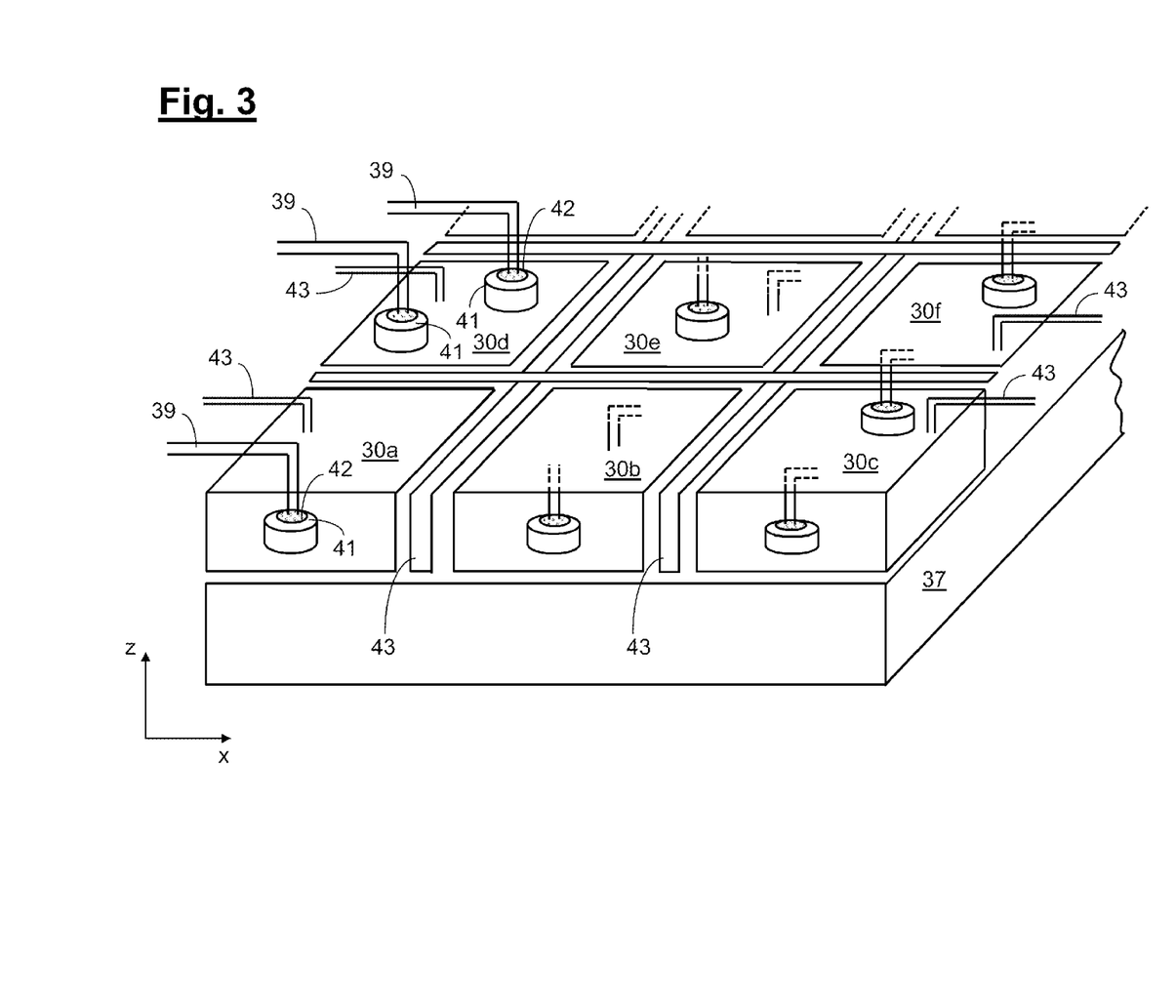
FIG. 3 shows a schematic illustration for describing the construction of an adaptive mirror in accordance with a third embodiment of the invention which utilizes a controllable mediator layer as well as separate control electrodes.

FIG. 3 shows a further embodiment, wherein components analogous or substantially functionally identical to those in FIG. 2 are designated by reference numerals increased by "10". In contrast to FIG. 2, in the case of the embodiment in FIG. 3, separate control electrodes 30a, 30b, 30c . . . (to which an electric field is able to be applied by way of leads 43) for controlling the conductivity of the mediator layer 37 are provided in a manner electrically insulated from one another, wherein electrodes 42 present once again analogously to FIG. 2 for controlling the deflection of the piezoelectric layer are situated within these electrode sections 30a, 30b, 30c . . . in a manner insulated independently by way of insulators 41. The setting of locally different values for the FET control voltage that is able to be realized in accordance with FIG. 3 enables the flexibility of the arrangement to be increased further. In this way, for example, at a predefined point in time, a desired fast setting of a specific deformation pattern can be restricted to a central region of the adaptive mirror, whereas e.g. in a radially outer region of the mirror it is possible to realize relatively larger deformation amplitudes on a longer time scale or with a lower setting speed. For this purpose, e.g. control electrodes 30a, 30b, 30c . . . arranged radially further inward can set a comparatively higher electrical conductivity of the mediator layer 37, while a comparatively lower electrical conductivity can be predefined by way of control electrodes arranged radially further outward.

Figure 4:
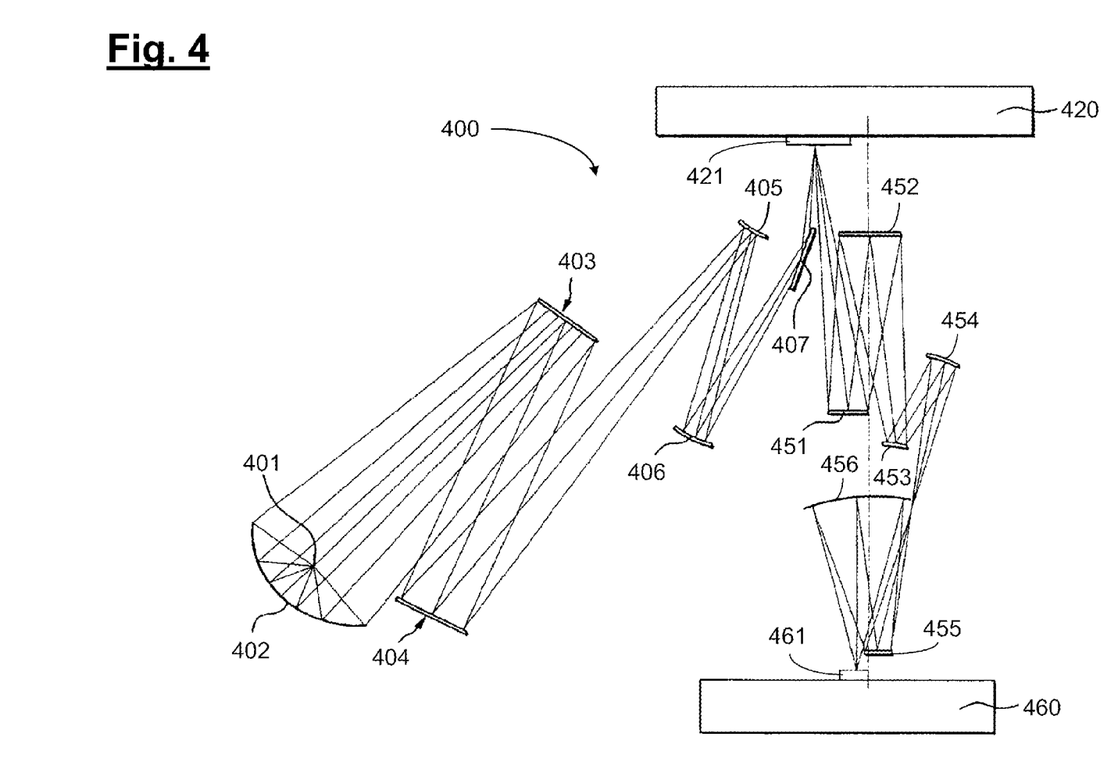
FIG. 4 shows a schematic illustration for describing the possible construction of a microlithographic projection exposure apparatus designed for operation in the EUV.

FIG. 4 shows a schematic illustration of an exemplary projection exposure apparatus which is designed for operation in the EUV and in which the present invention can be realized.

According to FIG. 4, an illumination device in a projection exposure apparatus 400 designed for EUV comprises a field facet mirror 403 and a pupil facet mirror 404. The light from a light source unit comprising a plasma light source 401 and a collector mirror 402 is directed onto the field facet mirror 403. A first telescope mirror 405 and a second telescope mirror 406 are arranged in the light path downstream of the pupil facet mirror 404. A deflection mirror 407 is arranged downstream in the light path, said deflection mirror directing the radiation that is incident thereon onto an object field in the object plane of a projection lens comprising six mirrors 451-456. At the location of the object field, a reflective structure-bearing mask 421 is arranged on a mask stage 420, said mask being imaged with the aid of the projection lens into an image plane in which a substrate 461 coated with a light-sensitive layer (photoresist) is situated on a wafer stage 460.

Of the mirrors 451-456 of the projection lens, the mirrors 451 and 452, which are arranged in the initial area of the projection lens with respect to the optical beam path, are good candidates to be configured in a manner according to the invention. This is so because the described effect of compensating for thermal deformations is particularly noticeable at these mirrors 451, 452 as a result of the still comparatively low summed reflection losses and the associated relatively high light intensities that prevail at these mirrors. However, the specific mirrors 451 and 452 are noted simply by way of example, since any of the other mirrors 453-456 can be configured in a manner according to the invention either in lieu of or in addition to the mirrors 451, 452.

Even though the invention has been described on the basis of specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended patent claims and equivalents thereof.

What is claimed is:

1. A mirror, having an optical effective surface and comprising:
   a mirror substrate;
   a reflection layer stack that reflects electromagnetic radiation incident on the optical effective surface;
   at least one piezoelectric layer arranged between the mirror substrate and the reflection layer stack;
   a first electrode arrangement situated on a side of the piezoelectric layer facing the reflection layer stack, and a second electrode arrangement situated on a side of the piezoelectric layer facing the mirror substrate, wherein the first electrode arrangement and the second electrode arrangement are arranged to apply an electric field to the piezoelectric layer that produces a locally variable deformation in the piezoelectric layer;
   wherein the first electrode arrangement and the second electrode arrangement each respectively has a plurality of electrodes, and wherein each of the electrodes has a respective lead configured to apply an electrical voltage relative to a respective other of the electrode arrangements; and
   a first mediator layer assigned to the first electrode arrangement and a second mediator layer assigned to the second electrode arrangement, wherein each of the mediator layers is arranged to set a respective continuous electrical potential profile along the respective electrode arrangement; and wherein the first and the second mediator layers differ from one another in average electrical resistance by a factor of at least 1.5.

2. The mirror as claimed in claim 1, wherein the mediator layers differ from one another in the average electrical resistance by a factor of at least 3.

3. The mirror as claimed in claim 1, wherein the mediator layers differ from one another in average thickness.

4. The mirror as claimed in claim 1, the mediator layers differ in stoichiometry from one another.

5. The mirror as claimed in claim 1, wherein at least one of the mediator layers comprises titanium dioxide ($TiO_2$), $LaCoO_3$, $LaMnO_3$, $LaCaMnO_3$ or $LaNiO_3$.

6. A mirror, having an optical effective surface and comprising
   a mirror substrate;
   a reflection layer stack that reflects electromagnetic radiation incident on the optical effective surface;
   at least one piezoelectric layer, arranged between the mirror substrate and the reflection layer stack
   a first electrode arrangement situated on a side of the piezoelectric layer facing the reflection layer stack, and a second electrode arrangement situated on a side of the piezoelectric layer facing the mirror substrate, wherein the first electrode arrangement and the second electrode arrangement are arranged to apply an electric field to the piezoelectric layer that produces a locally variable deformation in the piezoelectric layer; and
   at least one mediator layer assigned to at least one of the electrode arrangements and having a controllable electrical conductivity for setting a temporally variable continuous electrical potential profile along the at least one electrode arrangement.

7. The mirror as claimed in claim 6, further comprising at least one control electrode arranged to control the electrical conductivity of the mediator layer.

8. The mirror as claimed in claim 6, further comprising a plurality of mutually independently operable control electrodes arranged to control the electrical conductivity of the mediator layer.

9. The mirror as claimed in claim 1, configured for an operating wavelength of less than 30 nm.

10. The mirror as claimed in claim 1, configured for a microlithographic projection exposure apparatus.

11. An optical system configured as an illumination device or a projection lens of a microlithographic projection exposure apparatus, comprising a mirror as claimed in claim 1.

12. An optical system, comprising at least two mirrors,
   wherein each of the mirrors has a respective optical effective surface, a respective mirror substrate and a respective reflection layer stack that reflects electromagnetic radiation incident on the respective optical effective surface;
   wherein each of the mirrors has a respective piezoelectric layer arranged in each case between the respective mirror substrate and the respective reflection layer stack
   wherein each of the mirrors has a respective first electrode arrangement situated on a side of the respective piezoelectric layer facing the respective reflection layer stack, and a respective second electrode arrangement situated on a side of the respective piezoelectric layer facing the respective mirror substrate;
   wherein each of the mirrors has at least one respective mediator layer arranged to set a respective continuous electrical potential profile; and
   wherein each of the respective mediator layers has a respective average electrical resistance, such that the respective average electrical resistances differ from one another by a factor of at least 1.5.

13. The optical system as claimed in claim 12 and configured as an illumination device or as a projection lens of a microlithographic projection exposure apparatus.

14. The optical system as claimed in claim 12, wherein the mediator layers differ from one another such that the respective average electrical resistances differ by a factor of at least 5.

15. A microlithographic projection exposure apparatus comprising an illumination device and a projection lens, wherein at least one of the illumination device and the projection lens comprises an optical system as claimed in claim 12.

* * * * *

UNITED STATES PATENT AND TRADEMARK OFFICE
CERTIFICATE OF CORRECTION

PATENT NO. : 11,366,395 B2
APPLICATION NO. : 17/092282
DATED : June 21, 2022
INVENTOR(S) : Hild et al.

It is certified that error appears in the above-identified patent and that said Letters Patent is hereby corrected as shown below:

In the Specification

Column 8, Line 36, delete "direction." and insert -- direction, i.e., in the crystal direction provided in the notation known to those skilled in the art as Miller indices, in which given crystal directions are identified in the form: "[xyz]". --.

Signed and Sealed this
Twentieth Day of June, 2023

Katherine Kelly Vidal
*Director of the United States Patent and Trademark Office*